(12) United States Patent
Chida et al.

(10) Patent No.: US 10,080,302 B2
(45) Date of Patent: Sep. 18, 2018

(54) DISPLAY DEVICE

(71) Applicant: Semiconductor Energy Laboratory Co., Ltd., Atsugi-shi, Kanagawa-ken (JP)

(72) Inventors: Akihiro Chida, Isehara (JP); Hisao Ikeda, Zama (JP); Yoshiharu Hirakata, Ebina (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 305 days.

(21) Appl. No.: 14/255,183

(22) Filed: Apr. 17, 2014

(65) Prior Publication Data

US 2014/0321074 A1 Oct. 30, 2014

(30) Foreign Application Priority Data

Apr. 24, 2013 (JP) .................................. 2013-090859

(51) Int. Cl.
*H05K 7/14* (2006.01)
*G09F 9/30* (2006.01)
(Continued)

(52) U.S. Cl.
CPC .................. *H05K 7/14* (2013.01); *G09F 9/30* (2013.01); *G09F 9/301* (2013.01); *G09F 9/33* (2013.01); *G09F 9/35* (2013.01)

(58) Field of Classification Search
CPC ......... E06B 9/42; G06F 1/1652; G09G 5/373; G02F 1/09; B32B 3/14
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 001853137 A 10/2006
CN 102681607 A 9/2012
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Courtney Smith
*Assistant Examiner* — Jessey R Ervin
(74) *Attorney, Agent, or Firm* — Robinson Intellectual Property Law Office; Eric J. Robinson

(57) ABSTRACT

A novel foldable and highly portable display device is provided. Further, a novel display device capable of displaying information or the like on a seamless large screen is provided. The display device includes a flexible display panel, a first housing provided with a storage portion that includes a space in which pulled one end of the display panel is stored, a folding mechanism connected to the first housing, and a second housing connected to the folding mechanism. The other end of the display panel is connected to the second housing so that the display panel can be drawn in accordance with an opening operation of the folding mechanism and stored in accordance with a closing operation of the folding mechanism.

16 Claims, 7 Drawing Sheets

(51) Int. Cl.
*G09F 9/33* (2006.01)
*G09F 9/35* (2006.01)

(58) Field of Classification Search
USPC .............. 160/323.1; 345/661, 667, 1.3, 206; 361/679.06, 679.21, 679.26, 748–749; 174/250
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,174,628 B2 | 5/2012 | Matsushita et al. |
| 8,648,978 B2 | 2/2014 | Sato et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0049003 A1* | 2/2008 | Hasegawa ............ G06F 1/1615 345/206 |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0151480 A1* | 6/2008 | Chung ................. G06F 1/1615 361/679.06 |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0051830 A1* | 2/2009 | Matsushita ....... G02F 1/133305 348/836 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0060548 A1* | 3/2010 | Choi ..................... G06F 3/0414 345/1.3 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0008267 A1 | 1/2012 | Watanabe |
| 2012/0162876 A1 | 6/2012 | Kim |
| 2012/0217516 A1 | 8/2012 | Hatano et al. |
| 2012/0249891 A1 | 10/2012 | Sato et al. |
| 2013/0010405 A1* | 1/2013 | Rothkopf ............ H04M 1/0216 361/679.01 |
| 2013/0342094 A1* | 12/2013 | Walters .................... G09F 19/00 312/319.2 |
| 2014/0029171 A1* | 1/2014 | Lee .......................... H05K 7/16 361/679.01 |
| 2014/0099479 A1* | 4/2014 | Krall ............................ B32B 3/14 428/174 |
| 2014/0126121 A1* | 5/2014 | Griffin ................ H04M 1/0216 361/679.01 |
| 2014/0254111 A1 | 9/2014 | Yamazaki et al. |
| 2014/0268532 A1* | 9/2014 | Nicol .................. G09F 15/0062 361/679.26 |

FOREIGN PATENT DOCUMENTS

| | | |
|---|---|---|
| EP | 1672423 A | 6/2006 |
| EP | 1737044 A | 12/2006 |
| EP | 1970886 A | 9/2008 |
| EP | 2226847 A | 9/2010 |
| EP | 2383717 A | 11/2011 |
| EP | 2469808 A | 6/2012 |
| EP | 2919226 A | 9/2015 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |

(56) References Cited

FOREIGN PATENT DOCUMENTS

| | | |
|---|---|---|
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 3103323 B | 8/2004 |
| JP | 2004-273614 A | 9/2004 |
| JP | 2004-273732 A | 9/2004 |
| JP | 2005-115340 A | 4/2005 |
| JP | 2006-208424 A | 8/2006 |
| JP | 2008-052040 A | 3/2008 |
| JP | 2010-178188 A | 8/2010 |
| JP | 2011-018097 A | 1/2011 |
| JP | 2011-081069 A | 4/2011 |
| JP | 2011-176513 A | 9/2011 |
| JP | 2012-134971 A | 7/2012 |
| JP | 2012-190794 A | 10/2012 |
| JP | 2012-213119 A | 11/2012 |
| JP | 2013-050547 A | 3/2013 |
| KR | 2006-0095962 A | 9/2006 |
| KR | 2008-0057909 A | 6/2008 |
| KR | 2012-0079493 A | 7/2012 |
| WO | WO-2004/114391 | 12/2004 |
| WO | WO-2005/029176 | 3/2005 |
| WO | WO-2007/077649 | 7/2007 |
| WO | WO-2010/106590 | 9/2010 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", IEDM 05: Technical Digest of International Electron Devices Meeting, Dec. 5, 2005, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Gallium Zinc Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7, 8, 9, and 16) in the $In_2O_3$—$ZnGa_2O_4$—ZnO System,", Jounral of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous GIZO ($Ga_2O_3$—$Ga_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charged-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2018, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 4, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:"The Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastice Film and Its Bending Properites,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs,", IDW '09 : Proceedings of the 16th Internatinal Display Workshops, 2009, pp. 689-692.

(56) References Cited

OTHER PUBLICATIONS

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1100-1112.

Ohara.H et al., "21.3:4.0 In. QVGA Amoled Display Using In—Ga—Zn-Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composited for Display Applications,", SID International Symposium Digest of Technical Papers, May 31, 2009, pp. 572-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the In2O3 and SC2O3—A2O3—BO Systems [A; Fe, Ga, or Al; B: Mg, Mn, Fe, Ni, Cu, or Zn]at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Let. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

International Search Report (Application No. PCT/JP2014/061346) dated Jul. 8, 2014.

Written Opinion (Application No. PCT/JP2014/061346) dated Jul. 8, 2014.

\* cited by examiner

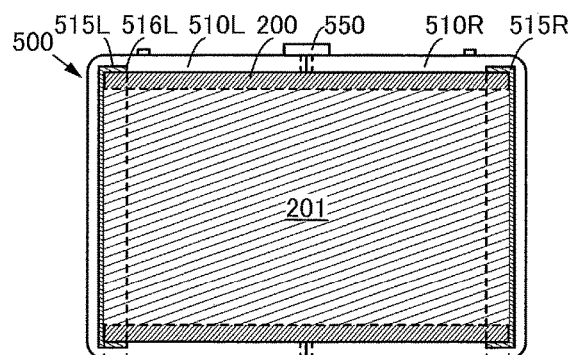
FIG. 1A1
FIG. 1A2
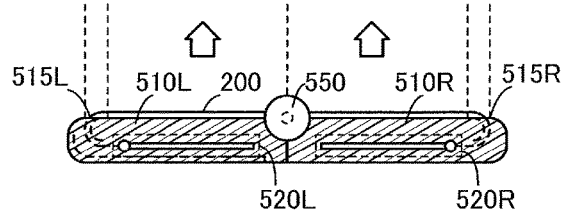
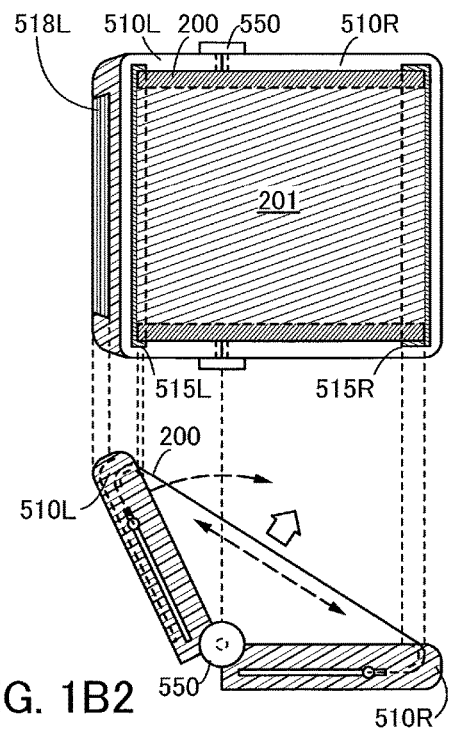
FIG. 1B1
FIG. 1B2
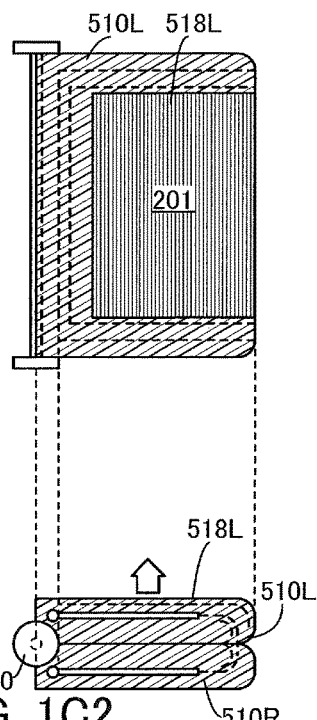
FIG. 1C1
FIG. 1C2

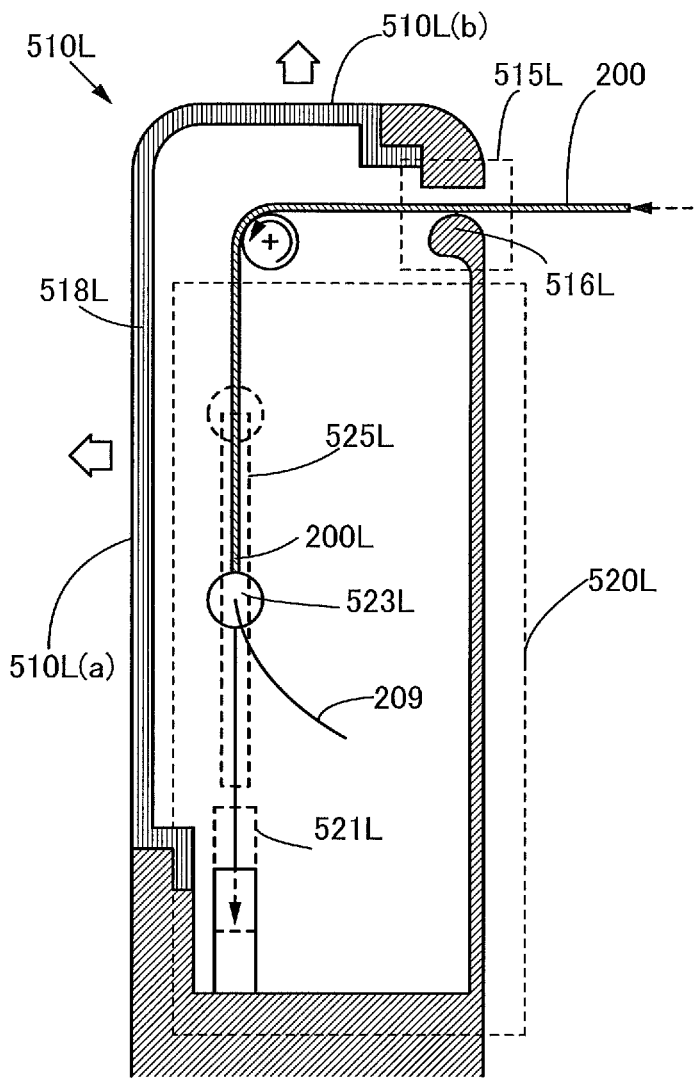
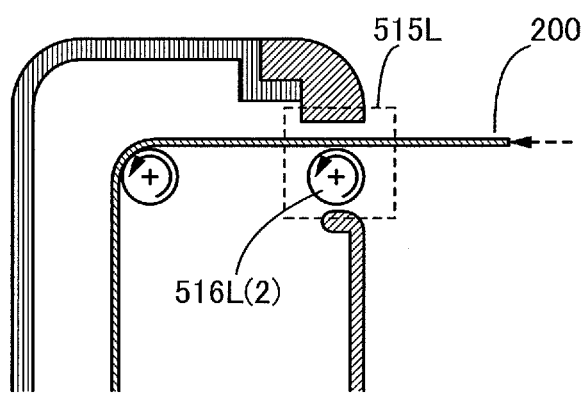

400B

DISPLAY DEVICE

TECHNICAL FIELD

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, a driving method thereof, or a manufacturing method thereof. In particular, the present invention relates to a display device.

BACKGROUND ART

The social infrastructures relating to means for transmitting information have advanced, which allows many pieces and various kinds of information to be acquired at and sent out from not only home or office but also other visiting places.

A display device with a large screen on which much information can be displayed at the same time is suitable for information terminal devices.

Moreover, portable information terminal devices with which information can be acquired at visiting places are under active development. Portable information terminal devices are often used outdoors, and force might be accidentally applied to the portable information terminal devices by dropping or the like.

As an example of a display device that can withstand external force and thus is not easily broken, a display device having high adhesiveness between a structure body by which a light-emitting layer is divided and a second electrode layer is known (Patent Document 1).

REFERENCE

Patent Document

[Patent Document 1] Japanese Published Patent Application No. 2012-190794

DISCLOSURE OF INVENTION

One embodiment of the present invention is made in view of the foregoing technical background. One object is to provide a novel foldable and highly portable display device. Another object is to provide a novel display device capable of displaying information or the like on a seamless large screen.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention includes a folding mechanism, a first housing connected to the folding mechanism, a second housing connected to the folding mechanism so that the second housing is configured to overlap with the first housing, and a flexible display panel configured to be stored in the first housing.

In the display device, the first housing includes a storage portion that includes a pulling mechanism that pulls one end of the display panel and a space in which the display panel is configured to be stored, and an opening portion connected to the storage portion. In addition, the display panel is drawn from the storage portion through the opening portion. Furthermore, the other end of the display panel is connected to the second housing so that the display panel is drawn in accordance with an opening operation of the folding mechanism and stored in accordance with a closing operation of the folding mechanism.

One embodiment of the present invention is the above-described display device in which the second housing includes a pulling mechanism that pulls the other end of the display panel, a storage portion that includes a space in which the display panel is stored, and an opening portion connected to the storage portion of the second housing.

With this structure, the display device can be folded with the angle of the flexible display panel with respect to the housings controlled, preventing a breakage of the display panel due to application of excessive stress to the display panel.

Consequently, a novel foldable and highly portable display device can be provided. Further, a novel display device capable of displaying information or the like on a seamless large screen can be provided.

One embodiment of the present invention is the above-described display device in which at least one of the opening portions includes a guide having a curvature radius of more than or equal to 1 mm and less than or equal to 10 mm on the folding mechanism side.

This can prevent the curvature radius of the pulled display panel from being smaller than the curvature radius of the guide. As a result, application of excessive stress to the display panel can be prevented.

One embodiment of the present invention is the above-described display device in which the first housing includes a window that transmits visible light in a position that enables the display panel stored in the storage portion of the first housing to be observed through the window.

Thus, a display region of the display panel stored in the storage portion of the display device in the folded state can be observed through the window.

Note that a display device in this specification means an image display device. In addition, the display device includes any of the following modules in its category: a module in which a connector such as a flexible printed circuit (FPC) or a tape carrier package (TCP) is attached to a display device; a module having a TCP provided with a printed wiring board at the end thereof; and a module having an integrated circuit (IC) directly mounted over a substrate over which a light-emitting element is formed by a chip on glass (COG) method.

With one embodiment of the present invention, a novel foldable and highly portable display device can be provided. Further, a novel display device capable of displaying information or the like on a seamless large screen can be provided.

BRIEF DESCRIPTION OF DRAWINGS

In the accompanying drawings:

FIGS. 1A1, 1A2, 1B1, 1B2, 1C1, and 1C2 illustrate a display device of an embodiment;

FIGS. 2A and 2B illustrate structures of a storage portion in a display device of an embodiment;

BEST MODE FOR CARRYING OUT THE INVENTION

Figure 3A:
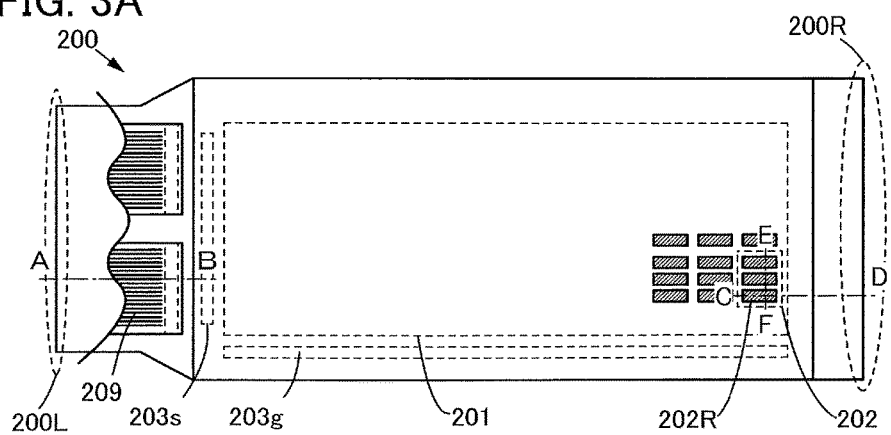
FIGS. 3A to 3C illustrate a structure of a display panel in a display device of an embodiment.

Example of Problem Solvable by One Embodiment of the Present Invention

A flexible display panel in which a display element and the like are provided over a flexible substrate is known.

When the flexible display panel is bent, compressive stress or tensile stress is applied to the display element and the like over the flexible substrate.

When the flexible substrate is bent to such a degree as to break a function film or a function element, a problem in which the flexible substrate cannot protect the function film or the function element of the display panel occurs.

One Embodiment of the Present Invention

The embodiments described below include one embodiment of the present invention created by focusing on a structure in which bending of the flexible display panel at the time of folding housings is controlled by pulling and storing the display panel.

A display device of one embodiment of the present invention includes a flexible display panel, a first housing provided with a storage portion that includes a space in which pulled one end of the display panel is stored, a folding mechanism connected to the first housing, and a second housing connected to the folding mechanism. The other end of the display panel is connected to the second housing so that the display panel can be drawn in accordance with an opening operation of the folding mechanism and stored in accordance with a closing operation of the folding mechanism.

With this structure, the display device can be folded with the angle of the flexible display panel with respect to the housings controlled, preventing a breakage of the display panel due to application of excessive stress to the display panel.

As a result, a novel foldable and highly portable display device can be provided. Further, a novel display device capable of displaying information or the like on a seamless large screen can be provided.

Embodiments will be described in detail with reference to drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments. Note that in the structures of the present invention described below, the same portions or portions having similar functions are denoted by the same reference numerals throughout different drawings, and description of such portions will not be repeated.

Embodiment 1

In this embodiment, a structure of a display device of one embodiment of the present invention will be described with reference to FIGS. 1A1, 1A2, 1B1, 1B2, 1C1, and 1C2 and FIGS. 2A and 2B.

FIGS. 1A1, 1B1, and 1C1 are plan views of the display device of one embodiment of the present invention. FIGS. 1A2, 1B2, and 1C2 are side views corresponding to FIGS. 1A1, 1B1, and 1C1, respectively.

FIGS. 1A1 and 1A2 illustrate a state in which the display device of one embodiment of the present invention is developed.

FIGS. 1B1 and 1B2 illustrate a state in which the display device of one embodiment of the present invention is folded halfway.

FIGS. 1C1 and 1C2 illustrate a state in which the display device of one embodiment of the present invention is folded up.

FIGS. 2A and 2B schematically illustrate structures of a storage portion that can be employed in the display device of one embodiment of the present invention.

A display device 500 described in this embodiment includes a folding mechanism 550, a first housing 510L connected to the folding mechanism 550, a second housing 510R connected to the folding mechanism 550 so as to overlap with the first housing 510L when the display device 500 is folded, and a flexible display panel 200 that is stored in the first housing 510L (see FIGS. 1A1, 1A2, 1B1, 1B2, 1C1, and 1C2). Note that the display panel 200 includes a display region 201 that can display information or the like.

The first housing 510L includes a pulling mechanism 521L that pulls one end 200L of the display panel 200, a storage portion 520L that includes a space in which the display panel 200 is stored, and an opening portion 515L connected to the storage portion 520L (see FIG. 2A).

The display panel 200 is drawn from the storage portion 520L through the opening portion 515L. The other end 200R is connected to the second housing 510R so that the display panel 200 is drawn in accordance with an opening operation of the folding mechanism 550 and stored in accordance with a closing operation of the folding mechanism 550 (see FIGS. 1A1, 1A2, 1B1, 1B2, 1C1, and 1C2).

With this structure, the flexible display panel 200 can be stored in the storage portion 520L from the end 200L side. In addition, the display device can be folded with the angle of the flexible display panel 200 with respect to the housings controlled. In addition, a breakage of the display panel 200 due to application of excessive stress can be prevented.

In the display device 500 described as an example in this embodiment, the second housing 510R is provided with a pulling mechanism that pulls the other end 200R of the display panel 200, a storage portion 520R including a space in which the display panel 200 is stored, and an opening portion 515R connected to the storage portion 520R (see FIGS. 1A1, 1A2, 1B1, 1B2, 1C1, and 1C2 and FIG. 3A).

With this structure, the flexible display panel 200 can be stored in the storage portion 520L and the storage portion 520R from the end 200L side and the end 200R side, respectively. In addition, the display device can be folded with the angle of the flexible display panel 200 with respect to the housings controlled. In addition, a breakage of the display panel 200 due to application of excessive stress can be prevented.

Consequently, the novel foldable and highly portable display device 500 can be provided. Furthermore, the novel display device 500 capable of displaying information or the like on a seamless large screen can be provided.

In the display device 500 described as an example in this embodiment, a window 518L that transmits visible light is provided in the first housing 510L in a position that enables the display panel 200 stored in the storage portion 520L to be observed through the window 518L (see FIGS. 1C1 and 1C2).

Thus, the display region 201 of the display panel 200 stored in the storage portion 520L of the display device 500 in the folded state can be observed through the window 518L.

Consequently, the novel foldable and highly portable display device 500 can be provided. Furthermore, the novel display device 500 capable of displaying information or the like on a seamless large screen can be provided. Moreover, the novel display device 500 whose displayed information is visible in the folded state can be provided.

Individual components of the display device of one embodiment of the present invention will be described below.

«Storage Portion»

The storage portion 520L includes a space in which the pulling mechanism 521L and the display panel 200 are stored (see FIG. 2A). The space has a size that allows the display panel 200 to be stored therein; a size that allows storage of the display panel 200 in a bent state or in a rolled state may be employed.

«Pulling Mechanism»

The pulling mechanism 521L pulls the end 200L of the display panel 200. As the pulling mechanism 521L, a tension spring, a spool, or the like can be used, for example.

For example, a tension spring whose one end is fixed to the first housing 510L can be used as the pulling mechanism 521L. The other end of the tension spring is connected to the end 200L of the display panel 200. With this structure, the tension spring is extended more as the display panel 200 is drawn more from the opening portion 515L. In addition, the tension spring pulls the drawn display panel 200 back to the space of the storage portion 520L.

Furthermore, the first housing 510L may be provided with a slider 523L that slides in a direction in which the pulling mechanism 521L pulls and a rail 525L that guides the slider 523L. In this case, an operation of drawing the display panel 200 and an operation of pulling back the display panel 200 by the pulling mechanism 521L can be performed stably.

This can prevent a problem such as unintentional bending of the display panel 200 in the storage portion 520L or the like in the folding operation of the display panel 200.

«Opening Portion»

The opening portion 515L is provided on one surface of the first housing 510L and connects the space of the storage portion 520L to the outside of the first housing 510L. In addition, the opening portion 515L has a size that allows the display panel 200 to be drawn from the storage portion 520L.

The opening portion 515L is provided with a guide 516L having a curvature radius of more than or equal to 1 mm and less than or equal to 10 mm on the folding mechanism 550 side, i.e., on the side in contact with the display panel 200 (see FIG. 2A).

This can prevent the curvature radius of the pulled display panel 200 from being smaller than the curvature radius of the guide 516L. Consequently, unintentional bending or application of excessive stress to the display panel 200 can be prevented.

Note that instead of the guide 516L, a cylindrical guide 516L(2) that is rotatably supported can be used (see FIG. 2B). When the guide 516L(2) is rotatably supported, a friction between the guide 516L(2) and a rear surface of the display panel 200 can be reduced.

Note that the radius of the cylindrical guide 516L(2) is preferably more than or equal to 1 mm and less than or equal to 10 mm.

«Window»

The window 518L transmits visible light.

The window 518L is provided on a surface of the first housing 510L that is opposite to the surface that faces the second housing 510R in the folded state so that the display region 201 of the stored display panel 200 can be observed through the window 518L (see FIGS. 1C1 and 1C2). Note that the first housing 510L is provided with the window 518L through which the display panel 200 can be observed from the side surface 510L(a) side and the side surface 510L(b) side.

Thus, a user can view and use information displayed on the display device 500 in the folded state.

«Folding Mechanism»

With the folding mechanism 550, the second housing 510R can be folded so as to overlap with the first housing 510L. For example, a hinge, a flexible member, or the like can be used as the folding mechanism 550.

Note that the folding mechanism 550 may be provided with a ratchet mechanism, a unit to prevent slipping, or the like in order to appropriately adjust the angle of the second housing 510R with respect to the first housing 510L.

«Display Panel»

The display panel 200 is flexible. One end 200L of the display panel 200 is connected to the pulling mechanism 521L, and the other end 200R thereof is connected to the second housing 510R.

The display panel 200 that can be used in the display device 500 includes a display element that can display information contained in a supplied signal. As the display element, a light-emitting element, electronic ink, a liquid crystal element, or the like is used, for example. Note that an example of the display panel 200 including light-emitting elements as display elements will be described in detail in Embodiment 2.

Usage modes of the display device 500 of one embodiment of the present invention will be described below.

«Usage Mode 1»

The first housing 510L and the second housing 510R are developed using the folding mechanism 550 as an axis (see FIGS. 1A1 and 1A2).

The display region 201 of the display panel 200 extends over the first housing 510L and the second housing 510R and displays images or the like in a direction indicated by arrows in FIG. 1A2. Note that since the display region 201 is seamless, favorable display with less visual discomfort due to gaps or joints can be performed. Furthermore, since the flexible display panel 200 is kept tightened by the tension applied by the pulling mechanism 521L, favorable display with less visual discomfort due to panel distortion can be performed. Moreover, since one end of the display region 201 reaches the opening portion 515L and the other end of the display region 201 reaches the opening portion 515R, a narrow bezel of the display region 201 can be achieved.

«Usage Mode 2»

The first housing 510L and the second housing 510R are folded in a direction indicated by an arc-shaped dashed arrow in FIG. 1B2, using the folding mechanism 550 as an axis (also see FIG. 1B1).

The display panel 200 is stored in the storage portion 520L and the storage portion 520R in accordance with the reduced length between the opening portion 515L of the first housing 510L and the opening portion 515R of the second housing 510R. The flexible display panel 200 is stretched tight and extends between the opening portion 515L and the opening portion 515R by the tension applied by the pulling mechanism 521L in a direction indicated by a linear dashed arrow. Note that the display panel 200 displays images or the like in a direction indicated by an open arrow in FIG. 1B2.

When the display device 500 is placed on a desk for example, this usage mode allows the angle of the display panel to be adjusted so that a user can view the display panel in a comfortable position. In addition, a user can appropriately adjust the size of a screen on which information or the like is displayed in accordance with the displayed information. Specifically, the aspect ratio can be adjusted to 4:3, 16:9, or 16:10, for example.

«Usage Mode 3»

The first housing 510L and the second housing 510R are folded using the folding mechanism 550 as an axis (see FIGS. 1C1 and 1C2).

The display region 201 of the display panel 200 stored in the first housing 510L can be observed through the window 518L. Note that the display region 201 of the display panel 200 is driven so as to display information in a region that is observed from the window 518L and so as not to display information in the other region. In this manner, power consumption can be reduced.

Thus, the display region 201 of the display panel 200 stored in the storage portion 520L of the display device 500 in the folded state can be used by being viewed through the window 518L.

This embodiment can be implemented in appropriate combination with any of the other embodiments in this specification.

Embodiment 2

In this embodiment, a structure of a display panel that can be used in the display device of one embodiment of the present invention will be described with reference to FIGS. 3A to 3C.

FIG. 3A is a plan view illustrating the structure of a display panel that can be used in the display device of one embodiment of the present invention.

Figure 3B:
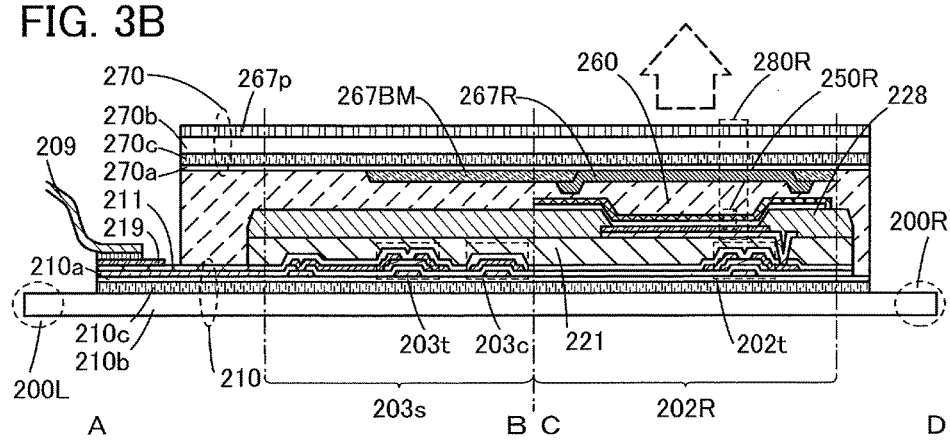

FIG. 3B is a cross-sectional view taken along line A-B and line C-D in FIG. 3A.

Figure 3C:
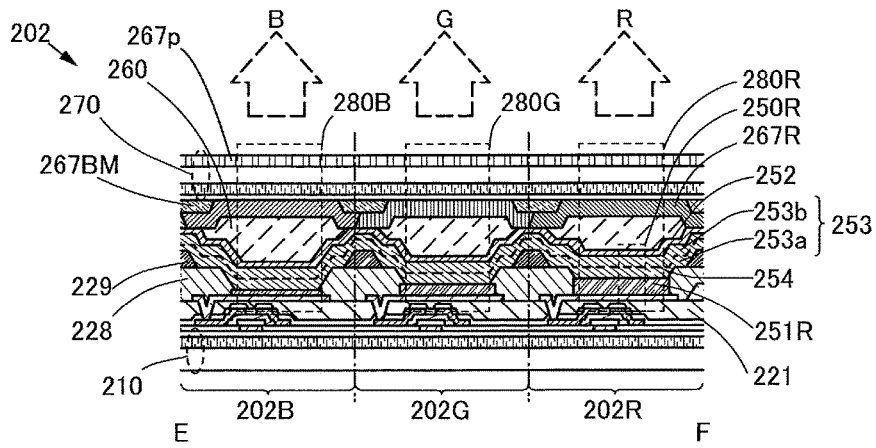

FIG. 3C is a cross-sectional view taken along line E-F in FIG. 3A.

<Plan View>

The display panel 200 described as an example in this embodiment includes one end 200L and the other end 200R (see FIG. 3A).

Furthermore, the display panel 200 described as an example in this embodiment includes the display region 201.

In the display region 201, a plurality of pixels 202 is provided, and a plurality of sub-pixels (e.g., a sub-pixel 202R) is provided in each of the pixels 202. In addition, in the sub-pixels, light-emitting elements and pixel circuits that can supply electric power for driving the light-emitting elements are provided.

The pixel circuits are electrically connected to wirings through which selection signals are supplied and wirings through which data signals are supplied.

Furthermore, the display panel 200 is provided with a scan line driver circuit 203g that can supply selection signals and a data line driver circuit 203s that can supply data signals.

<Cross-Sectional View>

The display panel 200 includes a substrate 210 and a counter substrate 270 that faces the substrate 210 (see FIG. 3B).

The substrate 210 is a stacked body including a flexible substrate 210b, a barrier film 210a that prevents diffusion of unintentional impurities to the light-emitting elements, and an adhesive layer 210c that attaches the barrier film 210a to the substrate 210b.

The counter substrate 270 is a stacked body including a flexible substrate 270b, a barrier film 270a that prevents diffusion of unintentional impurities to the light-emitting elements, and an adhesive layer 270c that attaches the barrier film 270a to the substrate 270b.

A sealant 260 that also serves as an optical adhesive layer attaches the counter substrate 270 to the substrate 210. The pixel circuits and the light-emitting elements (e.g., a first light-emitting element 250R) are provided between the substrate 210 and the counter substrate 270.

«Structure of Pixel»

Each of the pixels 202 includes a sub-pixel 202R, a sub-pixel 202G, and a sub-pixel 202B (see FIG. 3C). The sub-pixel 202R includes a light-emitting module 280R, the sub-pixel 202G includes a light-emitting module 280G, and the sub-pixel 202B includes a light-emitting module 280B.

For example, the sub-pixel 202R includes the first light-emitting element 250R and the pixel circuit that can supply electric power to the first light-emitting element 250R and includes a transistor 202t (see FIG. 3B). Furthermore, the sub-pixel 202R includes the light-emitting module 280R, and the light-emitting module 280R includes the first light-emitting element 250R and an optical element (e.g., a first coloring layer 267R).

The first light-emitting element 250R includes a first lower electrode 251R, an upper electrode 252, and a layer 253 containing a light-emitting organic compound between the first lower electrode 251R and the upper electrode 252.

The layer 253 containing a light-emitting organic compound includes a light-emitting unit 253a, a light-emitting unit 253b, and an intermediate layer 254 between the light-emitting units 253a and 253b.

The light-emitting module 280R includes the first coloring layer 267R on the counter substrate 270. The coloring layer transmits light of a particular wavelength and is, for example, a layer that selectively transmits light of red, green, or blue color. Note that a region that transmits light emitted from the light-emitting element as it is may be provided as well.

The light-emitting module 280R, for example, includes the sealant 260 that also serves as an optical adhesive layer and is in contact with the first light-emitting element 250R and the first coloring layer 267R.

The first coloring layer 267R is positioned in a region overlapping with the first light-emitting element 250R. Accordingly, part of light emitted from the first light-emitting element 250R passes through the sealant 260 that also serves as an optical adhesive layer and through the first coloring layer 267R and is emitted to the outside of the light-emitting module 280R as indicated by arrows in FIGS. 3B and 3C.

«Structure of Display Panel»

The display panel 200 includes a light-blocking layer 267BM on the counter substrate 270. The light-blocking layer 267BM is provided so as to surround the coloring layer (e.g., the first coloring layer 267R).

The display panel 200 includes an anti-reflective layer 267p positioned in a region overlapping with the display region 201.

The display panel 200 includes an insulating film 221. The insulating film 221 covers the transistor 202t. Note that the insulating film 221 can be used as a layer for planarizing unevenness caused by the pixel circuits. An insulating film on which a layer that can prevent diffusion of impurities to the transistor 202t and the like is stacked can be used as the insulating film 221.

The display panel 200 includes the light-emitting elements (e.g., the first light-emitting element 250R) over the insulating film 221.

The display panel 200 includes, over the insulating film 221, a partition wall 228 that overlaps with an end portion of the first lower electrode 251R (see FIG. 3C). In addition, a spacer 229 that controls the distance between the substrate 210 and the counter substrate 270 is provided on the partition wall 228.

«Structure of Data Line Driver Circuit»

The data line driver circuit 203s includes a transistor 203t and a capacitor 203c. Note that the driver circuit can be formed in the same process and over the same substrate as those of the pixel circuits.

«Other Structures»

The display panel 200 includes a wiring 211 through which a signal can be supplied. The wiring 211 is provided with a terminal 219. Note that a flexible printed circuit (FPC) 209 through which a signal such as a data signal or a synchronization signal can be supplied is electrically connected to the terminal 219.

Note that a printed wiring board (PWB) may be attached to the FPC. The light-emitting device in this specification includes, in its category, not only a light-emitting device itself but also a light-emitting device provided with an FPC or a PWB.

This embodiment can be implemented in appropriate combination with any of the other embodiments in this specification.

Embodiment 3

In this embodiment, a structure of a display portion that can be used in the display device of one embodiment of the present invention and a structure of a foldable touch panel that can be used in a positional information input portion will be described with reference to FIGS. 4A to 4C.

Figure 4A:
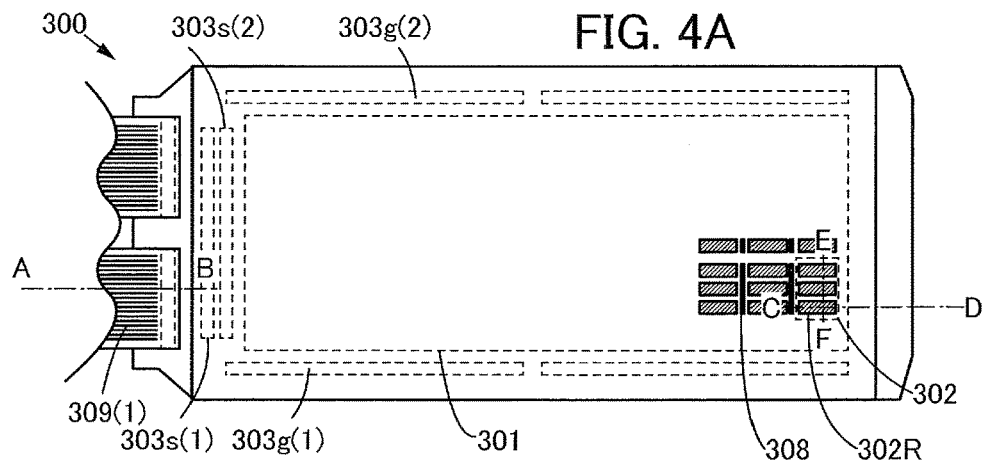
FIGS. 4A to 4C illustrate a structure of a touch panel that can be used in a data processing device of an embodiment.
Figure 4B:
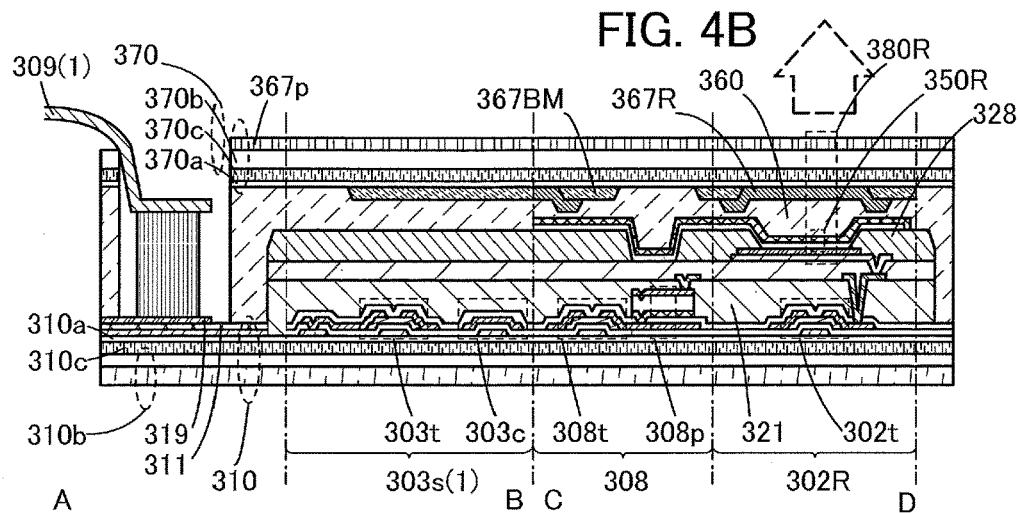
Figure 4C:
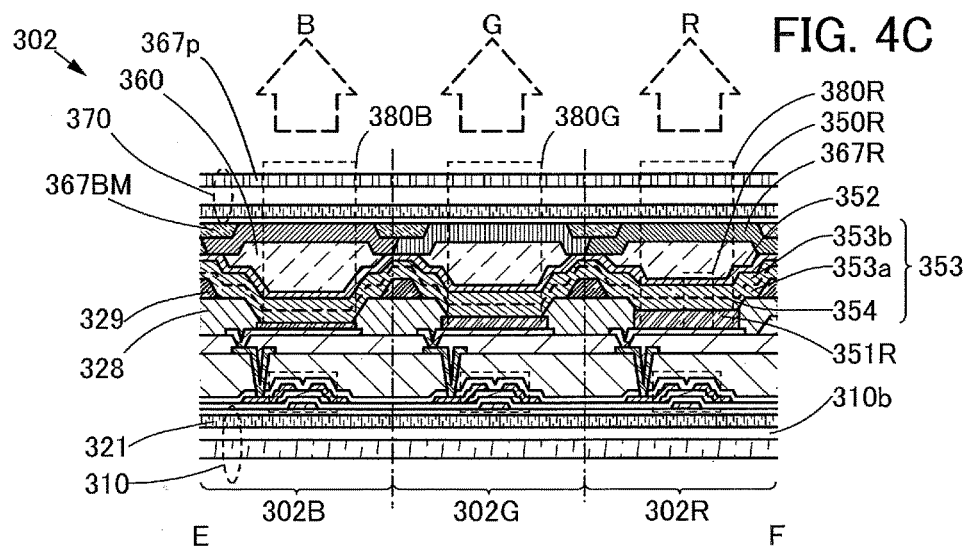

FIGS. 4A to 4C illustrate the structure of a touch panel that can be used in a data processing device in one embodiment of the present invention.

FIG. 4A is a plan view and FIG. 4B is a cross-sectional view taken along line A-B and line C-D in FIG. 4A.

FIG. 4C is a cross-sectional view taken along line E-F in FIG. 4A.

<Plan View>

A touch panel 300 described as an example in this embodiment includes a display portion 301 (see FIG. 4A).

The display portion 301 includes a plurality of pixels 302 and a plurality of imaging pixels 308. The imaging pixels 308 can sense a touch of a finger or the like on the display portion 301. Thus, a touch sensor can be formed using the imaging pixels 308.

Each of the pixels 302 includes a plurality of sub-pixels (e.g., a sub-pixel 302R). In addition, in the sub-pixels, light-emitting elements and pixel circuits that can supply electric power for driving the light-emitting elements are provided.

The pixel circuits are electrically connected to wirings through which selection signals are supplied and wirings through which image signals are supplied.

Furthermore, the touch panel 300 is provided with a scan line driver circuit 303g(1) that can supply selection signals to the pixels 302 and an image signal line driver circuit 303s(1) that can supply image signals to the pixels 302.

The imaging pixels 308 include photoelectric conversion elements and imaging pixel circuits that drive the photoelectric conversion elements.

The imaging pixel circuits are electrically connected to wirings through which control signals are supplied and wirings through which power supply potentials are supplied.

Examples of the control signals include a signal for selecting an imaging pixel circuit from which a recorded imaging signal is read, a signal for initializing an imaging pixel circuit, and a signal for determining the time it takes for an imaging pixel circuit to detect light.

The touch panel 300 is provided with an imaging pixel driver circuit 303g(2) that can supply control signals to the imaging pixels 308 and an imaging signal line driver circuit 303s(2) that reads out imaging signals.

<Cross-Sectional View>

The touch panel 300 includes a substrate 310 and a counter substrate 370 that faces the substrate 310 (see FIG. 4B).

By using a flexible material as the substrate 310 and the counter substrate 370, the touch panel 300 can have flexibility.

Note that when the flexible touch panel 300 is bent, stress is applied to a function element provided in the touch panel 300. A function element is preferably positioned in the center between the substrate 310 and the counter substrate 370 because a change in shape of the function element can be prevented.

Furthermore, the substrate 310 is preferably formed using a material whose coefficient of linear expansion is substantially equal to that of the counter substrate 370. For example, the coefficient of linear expansion of the materials are preferably lower than or equal to $1 \times 10^{-3}$/K, further preferably lower than or equal to $5 \times 10^{-5}$/K, and still further preferably lower than or equal to $1 \times 10^{-5}$/K.

For example, materials that include polyester, polyolefin, polyamide (e.g., nylon, aramid), polyimide, polycarbonate, or a resin having an acrylic bond, an urethane bond, an epoxy bond, or a siloxane bond can be used for the substrate 310 and the counter substrate 370.

The substrate 310 is a stacked body in which a flexible substrate 310b, a barrier film 310a that prevents diffusion of unintentional impurities to the light-emitting elements, and a resin layer 310c that attaches the barrier film 310a to the substrate 310b are stacked.

The counter substrate 370 is a stacked body including a flexible substrate 370b, a barrier film 370a that prevents diffusion of unintentional impurities to the light-emitting elements, and a resin layer 370c that attaches the barrier film 370a to the substrate 370b (see FIG. 4B).

A sealant 360 attaches the counter substrate 370 to the substrate 310. The sealant 360 also serving as an optical adhesive layer has a refractive index higher than that of air. The pixel circuits and the light-emitting elements (e.g., a first light-emitting element 350R) are provided between the substrate 310 and the counter substrate 370.

«Structure of Pixel»

Each of the pixels 302 includes a sub-pixel 302R, a sub-pixel 302G, and a sub-pixel 302B (see FIG. 4C). The sub-pixel 302R includes a light-emitting module 380R, the sub-pixel 302G includes a light-emitting module 380G, and the sub-pixel 302B includes a light-emitting module 380B.

For example, the sub-pixel 302R includes the first light-emitting element 350R and the pixel circuit that can supply electric power to the first light-emitting element 350R and includes a transistor 302t (see FIG. 4B). Furthermore, the light-emitting module 380R includes the first light-emitting element 350R and an optical element (e.g., a first coloring layer 367R).

The first light-emitting element 350R includes a first lower electrode 351R, an upper electrode 352, and a layer 353 containing a light-emitting organic compound between the first lower electrode 351R and the upper electrode 352 (see FIG. 4C).

The layer 353 containing a light-emitting organic compound includes a light-emitting unit 353a, a light-emitting unit 353b, and an intermediate layer 354 between the light-emitting units 353a and 353b.

The light-emitting module 380R includes the first coloring layer 367R on the counter substrate 370. The coloring layer transmits light of a particular wavelength and is, for example, a layer that selectively transmits light of red, green, or blue color. Note that a region that transmits light emitted from the light-emitting element as it is may be provided as well.

The light-emitting module 380R, for example, includes the sealant 360 that is in contact with the first light-emitting element 350R and the first coloring layer 367R.

The first coloring layer 367R is positioned in a region overlapping with the first light-emitting element 350R. Accordingly, part of light emitted from the first light-emitting element 350R passes through the sealant 360 that also serves as an optical adhesive layer and through the first coloring layer 367R and is emitted to the outside of the light-emitting module 380R as indicated by arrows in FIGS. 4B and 4C.

«Structure of Touch Panel»

The touch panel 300 includes a light-blocking layer 367BM on the counter substrate 370. The light-blocking layer 367BM is provided so as to surround the coloring layer (e.g., the first coloring layer 367R).

The touch panel 300 includes an anti-reflective layer 367p positioned in a region overlapping with the display portion 301. As the anti-reflective layer 367p, a circular polarizing plate can be used, for example.

The touch panel 300 includes an insulating film 321. The insulating film 321 covers the transistor 302t. Note that the insulating film 321 can be used as a layer for planarizing unevenness caused by the pixel circuits. An insulating film on which a layer that can prevent diffusion of impurities to the transistor 302t and the like is stacked can be used as the insulating film 321.

The touch panel 300 includes the light-emitting elements (e.g., the first light-emitting element 350R) over the insulating film 321.

The touch panel 300 includes, over the insulating film 321, a partition wall 328 that overlaps with an end portion of the first lower electrode 351R (see FIG. 4C). In addition, a spacer 329 that controls the distance between the substrate 310 and the counter substrate 370 is provided on the partition wall 328.

«Structure of Image Signal Line Driver Circuit»

The image signal line driver circuit 303s(1) includes a transistor 303t and a capacitor 303c. Note that the driver circuit can be formed in the same process and over the same substrate as those of the pixel circuits.

«Structure of Imaging Pixel»

The imaging pixels 308 each include a photoelectric conversion element 308p and an imaging pixel circuit for sensing light received by the photoelectric conversion element 308p. The imaging pixel circuit includes a transistor 308t.

For example, a PIN photodiode can be used as the photoelectric conversion element 308p.

«Other Structures»

The touch panel 300 includes a wiring 311 through which a signal can be supplied. The wiring 311 is provided with a terminal 319. Note that an FPC 309(1) through which a signal such as an image signal or a synchronization signal can be supplied is electrically connected to the terminal 319.

Note that a printed wiring board (PWB) may be attached to the FPC 309(1).

Transistors formed in the same process can be used as the transistor 302t, the transistor 303t, the transistor 308t, and the like.

Transistors of a bottom-gate type, a top-gate type, or the like can be used.

Any of various kinds of semiconductors can be used in the transistors. For example, an oxide semiconductor, single crystal silicon, polysilicon, amorphous silicon, or the like can be used.

This embodiment can be implemented in appropriate combination with any of the other embodiments in this specification.

Embodiment 4

In this embodiment, a structure of a foldable touch panel that can be used in the display device of one embodiment of the present invention will be described with reference to FIGS. 5A and 5B and FIGS. 6A to 6C.

Figure 5A:
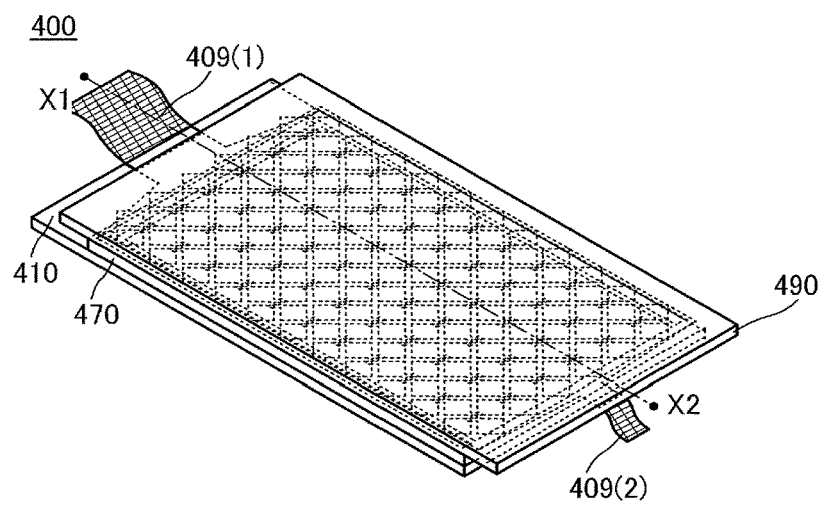
FIGS. 5A and 5B illustrate a structure of a touch panel that can be used in a data processing device of an embodiment.
Figure 5B:
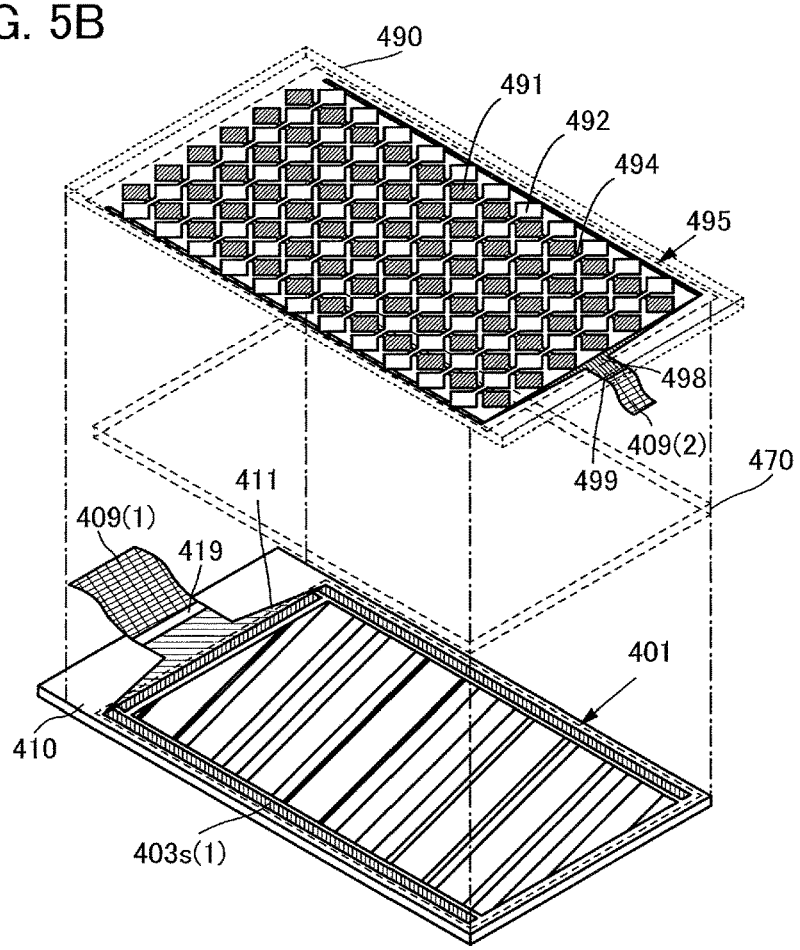

FIGS. 5A and 5B are perspective views illustrating typical components of a touch panel in one embodiment of the present invention. FIG. 5A is a perspective view of a touch panel 400, and FIG. 5B is a perspective view illustrating the components of the touch panel 400 in a separated state.

Figure 6A:
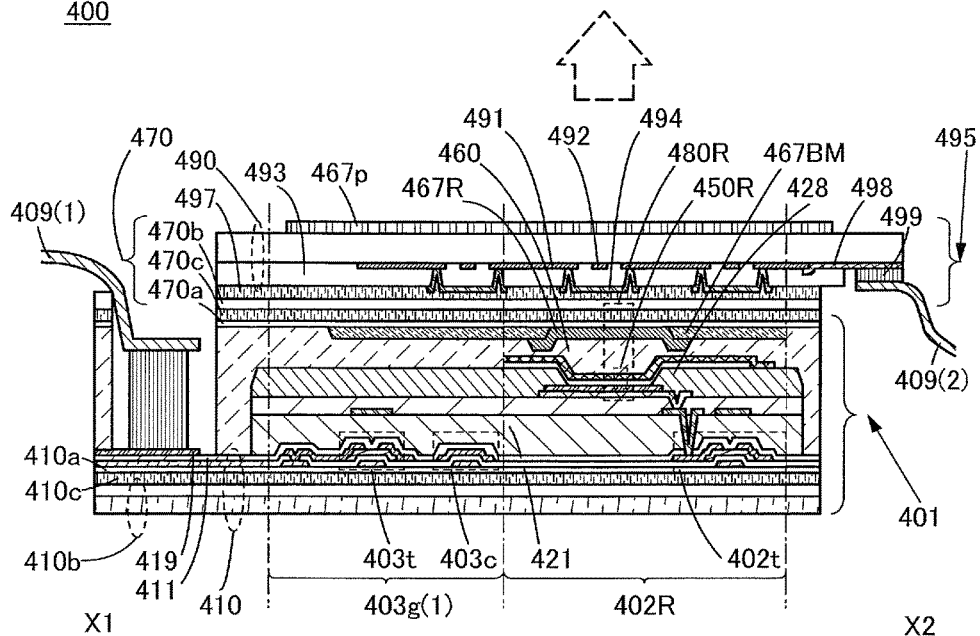
FIGS. 6A to 6C illustrate structures of a touch panel that can be used in a data processing device of an embodiment.
Figure 6B:
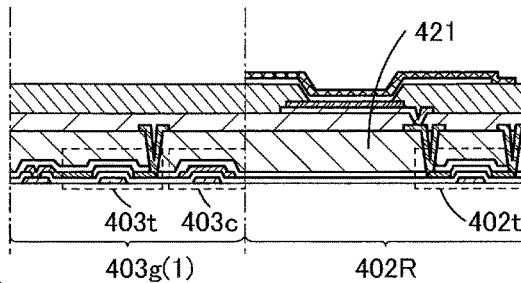
Figure 6C:
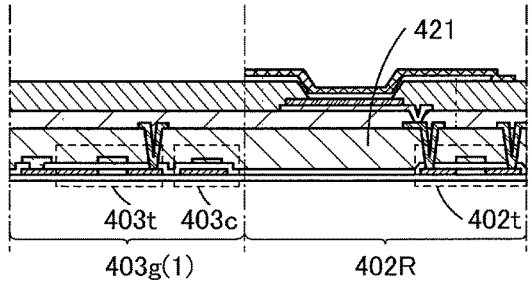

FIGS. 6A to 6C are cross-sectional views of the touch panel 400 taken along line X1-X2 in FIG. 5A.

The touch panel 400 includes a display portion 401 and a touch sensor 495 (see FIG. 5B). Furthermore, the touch panel 400 includes a substrate 410, a substrate 470, and a substrate 490. Note that the substrate 410, the substrate 470, and the substrate 490 each have flexibility.

The display portion 401 includes the substrate 410, a plurality of pixels over the substrate 410, and a plurality of wirings 411 through which signals are supplied to the pixels. The plurality of wirings 411 is led to a peripheral portion of the substrate 410, and part of the plurality of wirings 411 forms a terminal 419. The terminal 419 is electrically connected to an FPC 409(1).

<Touch Sensor>

The substrate 490 includes the touch sensor 495 and a plurality of wirings 498 electrically connected to the touch sensor 495. The plurality of wirings 498 is led to a peripheral portion of the substrate 490, and part of the plurality of wirings 498 forms a terminal. The terminal is electrically connected to an FPC 409(2). Note that in FIG. 5B, electrodes, wirings, and the like of the touch sensor 495 provided on the back side of the substrate 490 (the side opposite to the viewer side) are indicated by solid lines for clarity.

As the touch sensor 495, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive touch sensor is preferable because multiple points can be sensed simultaneously.

An example of using a projected capacitive touch sensor will be described below with reference to FIG. 5B.

Note that a variety of sensors that can sense the closeness or the contact of a sensing target such as a finger, can be used.

The projected capacitive touch sensor 495 includes electrodes 491 and electrodes 492. The electrodes 491 are electrically connected to any of the plurality of wirings 498, and the electrodes 492 are electrically connected to any of the other wirings 498.

The electrodes 492 each have a shape of a plurality of quadrangles arranged in one direction with one corner of a quadrangle connected to one corner of another quadrangle as illustrated in FIGS. 5A and 5B.

A plurality of electrodes 491 each have a quadrangular shape and are arranged in a direction intersecting with the direction in which the electrodes 492 extend.

A wiring 494 electrically connects two electrodes 491 between which the electrode 492 is positioned. The intersecting area of the electrode 492 and the wiring 494 is preferably as small as possible. Such a structure allows a reduction in the area of a region where the electrodes are not provided, reducing unevenness in transmittance. As a result, unevenness in luminance of light from the touch sensor 495 can be reduced.

Note that the shapes of the electrodes 491 and the electrodes 492 are not limited to the above-mentioned shapes and can be any of a variety of shapes. For example, the plurality of electrodes 491 may be provided so that space between the electrodes 491 are reduced as much as possible, and a plurality of electrodes 492 may be provided with an insulating layer sandwiched between the electrodes 491 and the electrodes 492 and may be spaced apart from each other to form a region not overlapping with the electrodes 491. In that case, between two adjacent electrodes 492, it is preferable to provide a dummy electrode which is electrically insulated from these electrodes, whereby the area of a region having a different transmittance can be reduced.

A structure of the touch sensor 495 will be described with reference to FIGS. 6A to 6C.

The touch sensor 495 includes the substrate 490, the electrodes 491 and the electrodes 492 provided in a staggered arrangement on the substrate 490, an insulating layer 493 covering the electrodes 491 and the electrodes 492, and the wiring 494 that electrically connects the adjacent electrodes 491 to each other.

A resin layer 497 attaches the substrate 490 to the substrate 470 so that the touch sensor 495 overlaps with the display portion 401.

The electrodes 491 and the electrodes 492 are formed using a light-transmitting conductive material. As the light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film containing graphene oxide. As a reducing method, a method with application of heat or the like can be employed.

The electrodes 491 and the electrodes 492 may be formed by depositing a light-transmitting conductive material on the substrate 490 by a sputtering method and then removing an unnecessary portion by any of various patterning techniques such as photolithography.

Examples of a material for the insulating layer 493 are a resin such as acrylic or epoxy resin, a resin having a siloxane bond, and an inorganic insulating material such as silicon oxide, silicon oxynitride, or aluminum oxide.

Furthermore, openings reaching the electrodes 491 are formed in the insulating layer 493, and the wiring 494 electrically connects the adjacent electrodes 491. A light-transmitting conductive material can be favorably used as the wiring 494 because the aperture ratio of the touch panel can be increased. Moreover, a material with higher conductivity than the conductivities of the electrodes 491 and 492 can be favorably used because electric resistance can be reduced.

One electrode 492 extends in one direction, and a plurality of electrodes 492 is provided in the form of stripes.

The wiring 494 intersects with the electrode 492.

Adjacent electrodes 491 are provided with one electrode 492 provided therebetween. The wiring 494 electrically connects the adjacent electrodes 491.

Note that the plurality of electrodes 491 is not necessarily arranged in the direction orthogonal to one electrode 492 and may be arranged to intersect with one electrode 492 at an angle of less than 90 degrees.

One wiring 498 is electrically connected to any of the electrodes 491 and 492. Part of the wiring 498 serves as a terminal. For the wiring 498, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 493 and the wiring 494 may be provided to protect the touch sensor 495.

Furthermore, a connection layer 499 electrically connects the wiring 498 to the FPC 409(2).

As the connection layer 499, any of various anisotropic conductive films (ACF), anisotropic conductive pastes (ACP), or the like can be used.

The resin layer 497 has a light-transmitting property. For example, a thermosetting resin or an ultraviolet curable resin can be used; specifically, a resin such as acrylic, urethane, epoxy resin, or a resin having a siloxane bond can be used.

(Display Portion)

The display portion 401 includes a plurality of pixels arranged in a matrix. Each of the pixels includes a display element and a pixel circuit for driving the display element.

In this embodiment, an example of using an organic electroluminescent element that emits white light as a display element will be described; however, the display element is not limited to such element.

For example, organic electroluminescent elements that emit light of different colors may be included in sub-pixels so that the light of different colors can be emitted from the respective sub-pixels.

Other than organic electroluminescent elements, any of various display elements such as display elements (electronic ink) that perform display by an electrophoretic method, an electronic liquid powder method, an electrowetting method, or the like; MEMS shutter display elements; optical interference type MEMS display elements; and liquid crystal elements can be used. Furthermore, this embodiment can be used in a transmissive liquid crystal display, a transflective liquid crystal display, a reflective liquid crystal display, a direct-view liquid crystal display, or the like. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. A structure suitable for employed display elements can be selected from among a variety of structures of pixel circuits.

In the display portion, an active matrix method in which an active element is included in a pixel or a passive matrix method in which an active element is not included in a pixel can be used.

In an active matrix method, as an active element (a non-linear element), not only a transistor but also various active elements (non-linear elements) can be used. For example, an MIM (metal insulator metal), a TFD (thin film diode), or the like can also be used. Since these elements can be formed with a smaller number of manufacturing steps, manufacturing cost can be reduced or yield can be improved. Furthermore, since the size of these elements is small, the aperture ratio can be improved, so that power consumption can be reduced or higher luminance can be achieved.

As a method other than an active matrix method, a passive matrix method in which an active element (a non-linear element) is not used can also be used. Since an active element (a non-linear element) is not used, the number of manufacturing steps is small, so that manufacturing cost can be reduced or yield can be improved. Furthermore, since an active element (a non-linear element) is not used, the aperture ratio can be improved, so that power consumption can be reduced or higher luminance can be achieved, for example.

Flexible materials can be favorably used in the substrate 410 and the substrate 470.

Materials with which unintended passage of impurities is inhibited can be favorably used in the substrate 410 and the substrate 470. For example, materials with a vapor permeability of lower than or equal to $10^{-5}$ g/m$^2$·day, preferably lower than or equal to $10^{-6}$ g/m$^2$·day can be favorably used.

The substrate 410 can be favorably formed using a material whose coefficient of linear expansion is substantially equal to that of the substrate 470. For example, the coefficient of linear expansion of the materials are preferably lower than or equal to $1\times10^{-3}$/K, further preferably lower than or equal to $5\times10^{-5}$/K, and still further preferably lower than or equal to $1\times10^{-5}$/K.

The substrate 410 is a stacked body in which a flexible substrate 410b, a barrier film 410a that prevents diffusion of unintended impurities to light-emitting elements, and a resin layer 410c that attaches the barrier film 410a to the substrate 410b are stacked.

For example, materials that include polyester, polyolefin, polyamide (e.g., nylon, aramid), polyimide, polycarbonate, or a resin having an acrylic bond, an urethane bond, an epoxy bond, or a siloxane bond can be used for the resin layer 410c.

The substrate 470 is a stacked body in which a flexible substrate 470b, a barrier film 470a that prevents diffusion of unintended impurities to the light-emitting elements, and a resin layer 470c that attaches the barrier film 470a to the substrate 470b are stacked.

A sealant 460 attaches the substrate 470 to the substrate 410. The sealant 460 has a refractive index higher than that of air. In the case of extracting light to the sealant 460 side, the sealant 460 serves as an optical adhesive layer. The pixel circuits and the light-emitting elements (e.g., a first light-emitting element 450R) are provided between the substrate 410 and the substrate 470.

«Structure of Pixel»

A pixel includes a sub-pixel 402R, and the sub-pixel 402R includes a light-emitting module 480R.

The sub-pixel 402R includes the first light-emitting element 450R and the pixel circuit that can supply electric power to the first light-emitting element 450R and includes a transistor 402t. Furthermore, the light-emitting module 480R includes the first light-emitting element 450R and an optical element (e.g., a first coloring layer 467R).

The first light-emitting element 450R includes a lower electrode, an upper electrode, and a layer containing a light-emitting organic compound between the lower electrode and the upper electrode.

The light-emitting module 480R includes the first coloring layer 467R on the light extraction side. The coloring layer transmits light of a particular wavelength and is, for example, a layer that selectively transmits light of red, green, or blue color. Note that in another sub-pixel, a region that transmits light emitted from the light-emitting element as it is may be provided as well.

In the case where the sealant 460 is provided on the light extraction side, the sealant 460 is in contact with the first light-emitting element 450R and the first coloring layer 467R.

The first coloring layer 467R is positioned in a region overlapping with the first light-emitting element 450R. Accordingly, part of light emitted from the first light-emitting element 450R passes through the first coloring layer 467R and is emitted to the outside of the light-emitting module 480R as indicated by an arrow in FIG. 6A.

«Structure of Display Portion»

The display portion 401 includes a light-blocking layer 467BM on the light extraction side. The light-blocking layer 467BM is provided so as to surround the coloring layer (e.g., the first coloring layer 467R).

The display portion 401 includes an anti-reflective layer 467p positioned in a region overlapping with pixels. As the anti-reflective layer 467p, a circular polarizing plate can be used, for example.

The display portion 401 includes an insulating film 421. The insulating film 421 covers the transistor 402t. Note that the insulating film 421 can be used as a layer for planarizing unevenness caused by the pixel circuits. A stacked film including a layer that can prevent diffusion of impurities can be used as the insulating film 421. This can prevent the reliability of the transistor 402t or the like from being lowered by diffusion of unintentional impurities.

The display portion 401 includes the light-emitting elements (e.g., the first light-emitting element 450R) over the insulating film 421.

The display portion 401 includes, over the insulating film 421, a partition wall 428 that overlaps with an end portion of the lower electrode. In addition, a spacer that controls the distance between the substrate 410 and the substrate 470 is provided on the partition wall 428.

«Structure of Scan Line Driver Circuit»

A scan line driver circuit 403g(1) includes a transistor 403t and a capacitor 403c. Note that the driver circuit can be formed in the same process and over the same substrate as those of the pixel circuits.

«Other Structures»

The display portion 401 includes the wirings 411 through which signals can be supplied. The wirings 411 are provided with the terminal 419. Note that the FPC 409(1) through which a signal such as an image signal or a synchronization signal can be supplied is electrically connected to the terminal 419.

Note that a printed wiring board (PWB) may be attached to the FPC 409(1).

The display portion 401 includes wirings such as scan lines, signal lines, and power supply lines. Any of various conductive films can be used as the wirings.

Specifically, a metal element selected from aluminum, chromium, copper, tantalum, titanium, molybdenum, tungsten, nickel, yttrium, zirconium, silver, and manganese; an alloy including any of the above-described metal elements; an alloy including any of the above-described metal elements in combination; or the like can be used. In particular, one or more elements selected from aluminum, chromium, copper, tantalum, titanium, molybdenum, and tungsten are preferably included. In particular, an alloy of copper and manganese is suitably used in microfabrication with the use of a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like can be used.

Specifically, a stacked structure in which a film of an element selected from titanium, tantalum, tungsten, molybdenum, chromium, neodymium, and scandium, an alloy film including some of these elements, or a nitride film of any of these elements is stacked over an aluminum film can be used.

Alternatively, a light-transmitting conductive material including indium oxide, tin oxide, or zinc oxide may be used.

Modification Example 1 of Display Portion

Any of various kinds of transistors can be used in the display portion 401.

A structure in the case of using bottom-gate transistors in the display portion 401 is illustrated in FIGS. 6A and 6B.

For example, a semiconductor layer containing an oxide semiconductor, amorphous silicon, or the like can be used in the transistor 402t and the transistor 403t illustrated in FIG. 6A.

For example, a film represented by an In-M-Zn oxide that contains at least indium (In), zinc (Zn), and M (M is a metal such as Al, Ga, Ge, Y, Zr, Sn, La, Ce, or Hf) is preferably included. Moreover, both In and Zn are preferably contained.

As a stabilizer, gallium (Ga), tin (Sn), hafnium (Hf), aluminum (Al), zirconium (Zr), or the like can be used. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be used.

As an oxide semiconductor included in an oxide semiconductor film, any of the followings can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, and an In—Ga-based oxide.

Note that here, for example, an "In—Ga—Zn-based oxide" means an oxide containing In, Ga, and Zn as its main components and there is no limitation on the ratio of In:Ga:Zn. The In—Ga—Z-based oxide may contain another metal element in addition to In, Ga, and Zn.

For example, a semiconductor layer containing polycrystalline silicon that is obtained by crystallization process such as laser annealing can be used in the transistor 402t and the transistor 403t illustrated in FIG. 6B.

A structure in the case of using top-gate transistors in the display portion 401 is illustrated in FIG. 6C.

For example, a semiconductor layer including polycrystalline silicon, a single crystal silicon film that is transferred from a single crystal silicon substrate, or the like can be used in the transistor 402t and the transistor 403t illustrated in FIG. 6C.

This embodiment can be implemented in appropriate combination with any of the other embodiments in this specification.

Embodiment 5

In this embodiment, a structure of a foldable touch panel that can be used in the display device of one embodiment of the present invention will be described with reference to FIGS. 7A to 7C.

Figure 7A:
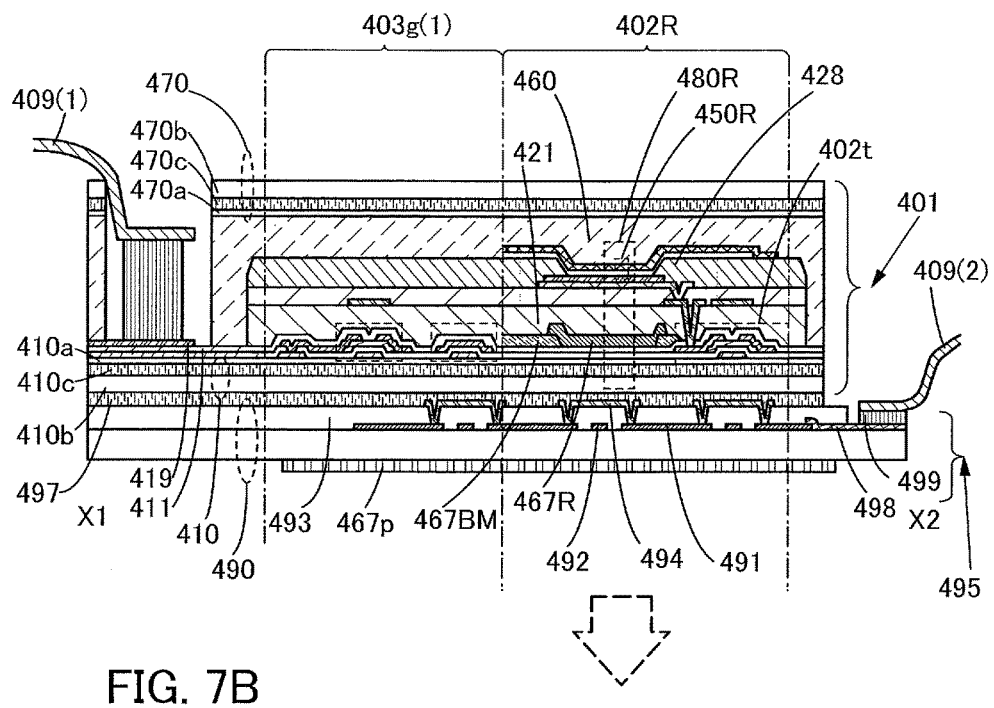
FIGS. 7A to 7C illustrate structures of a touch panel that can be used in a data processing device of an embodiment.
Figure 7B:
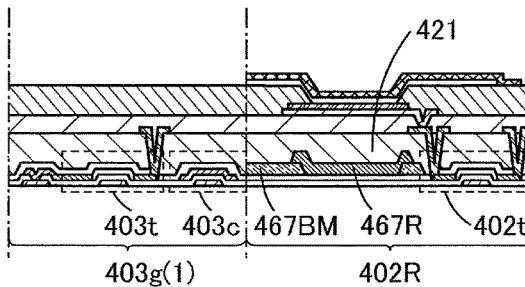
Figure 7C:
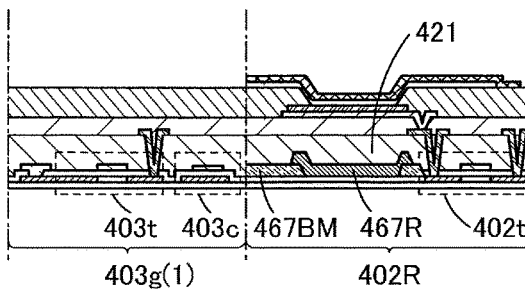

FIGS. 7A to 7C are cross-sectional views illustrating a structure of a touch panel 400B.

The touch panel 400B described in this embodiment is different from the touch panel 400 described in Embodiment 4 in that the display portion 401 displays received image data to the side where the transistors are provided and that the touch sensor is provided on the substrate 410 side of the display portion. Different structures will be described in detail below, and the above description is referred to for the other similar structures.

<Display Portion>

The display portion 401 includes a plurality of pixels arranged in a matrix. Each of the pixels includes a display element and a pixel circuit for driving the display element.

«Structure of Pixel»

A pixel includes the sub-pixel 402R, and the sub-pixel 402R includes a light-emitting module 480R.

The sub-pixel 402R includes the first light-emitting element 450R and the pixel circuit that can supply electric power to the first light-emitting element 450R and includes the transistor 402t.

The light-emitting module 480R includes the first light-emitting element 450R and an optical element (e.g., the first coloring layer 467R).

The first light-emitting element 450R includes a lower electrode, an upper electrode, and a layer containing a light-emitting organic compound between the lower electrode and the upper electrode.

The light-emitting module 480R includes the first coloring layer 467R on the light extraction side. The coloring layer transmits light of a particular wavelength and is, for example, a layer that selectively transmits light of red, green, or blue color. Note that in another sub-pixel, a region that transmits light emitted from the light-emitting element as it is may be provided as well.

The first coloring layer 467R is positioned in a region overlapping with the first light-emitting element 450R. The first light-emitting element 450R illustrated in FIG. 7A emits light to the side where the transistor 402t is provided. Accordingly, part of light emitted from the first light-emitting element 450R passes through the first coloring layer 467R and is emitted to the outside of the light-emitting module 480R as indicated by an arrow in FIG. 7A.

«Structure of Display Portion»

The display portion 401 includes a light-blocking layer 467BM on the light extraction side. The light-blocking layer 467BM is provided so as to surround the coloring layer (e.g., the first coloring layer 467R).

The display portion 401 includes an insulating film 421. The insulating film 421 covers the transistor 402t. Note that the insulating film 421 can be used as a layer for planarizing unevenness caused by the pixel circuits. A stacked film including a layer that can prevent diffusion of impurities can be used as the insulating film 421. This can prevent reliability of the transistor 402t or the like from being lowered by diffusion of unintentional impurities from the first coloring layer 467R.

<Touch Sensor>

The touch sensor 495 is provided on the substrate 410 side of the display portion 401 (see FIG. 7A).

The resin layer 497 is provided between the substrate 410 and the substrate 490 and attaches the touch sensor 495 to the display portion 401.

Modification Example 1 of Display Portion

Any of various kinds of transistors can be used in the display portion 401.

A structure in the case of using bottom-gate transistors in the display portion 401 is illustrated in FIGS. 7A and 7B.

For example, a semiconductor layer containing an oxide semiconductor, amorphous silicon, or the like can be used in the transistor 402t and the transistor 403t illustrated in FIG. 7A. In the transistors, a channel formation region may be sandwiched between upper and lower gate electrodes, in which case variations in characteristics of the transistors can be prevented and thus the reliability can be increased.

For example, a semiconductor layer containing polycrystalline silicon or the like can be used in the transistor 402t and the transistor 403t illustrated in FIG. 7B.

A structure in the case of using top-gate transistors in the display portion 401 is illustrated in FIG. 7C.

For example, a semiconductor layer including polycrystalline silicon, a transferred single crystal silicon film, or the like can be used in the transistor 402t and the transistor 403t illustrated in FIG. 7C.

This embodiment can be implemented in appropriate combination with any of the other embodiments in this specification.

EXPLANATION OF REFERENCE

200: display panel, 200L: end, 200R: end, 201: display region, 202: pixel, 202B: sub-pixel, 202G: sub-pixel, 202R: sub-pixel, 202t: transistor, 203c: capacitor, 203g: scan line driver circuit, 203s: data line driver circuit, 203t: transistor, 210: substrate, 210a: barrier film, 210b: substrate, 210c: adhesive layer, 211: wiring, 219: terminal, 221: insulating film, 228: partition wall, 229: spacer, 250R: light-emitting element, 251R: lower electrode, 252: upper electrode, 253: layer, 253a: light-emitting unit, 253b: light-emitting unit, 254: intermediate layer, 260: sealant, 267BM: light-blocking layer, 267p: anti-reflective layer, 267R: coloring layer, 270: counter substrate, 270a: barrier film, 270b: substrate, 270c: adhesive layer, 280B: light-emitting module, 280G: light-emitting module, 280R: light-emitting module, 300: touch panel, 301: display portion, 302: pixel, 302B: sub-pixel, 302G: sub-pixel, 302R: sub-pixel, 302t: transistor, 303c: capacitor, 303g(1): scan line driver circuit, 303g(2): imaging pixel driver circuit, 303s(1): image signal line driver circuit, 303s(2): imaging signal line driver circuit, 303t: transistor, 308: imaging pixel, 308p: photoelectric conversion element, 308t: transistor, 309: FPC, 310: substrate, 310a: barrier film, 310b: substrate, 310c: resin layer, 311: wiring, 319: terminal, 321: insulating film, 328: partition wall, 329: spacer, 350R: light-emitting element, 351R: lower electrode, 352: upper electrode, 353: layer, 353a: light-emitting unit, 353b: light-emitting unit, 354: intermediate layer, 360: sealant, 367BM: light-blocking layer, 367p: anti-reflective layer, 367R: coloring layer, 370: counter substrate, 370a: barrier film, 370b: substrate, 370c: resin layer, 380B: light-emitting module, 380G: light-emitting module, 380R: light-emitting module, 400: touch panel, 400B: touch panel, 401: display portion, 402R: sub-pixel, 402t: transistor, 403c: capacitor, 403g: scan line driver circuit, 403t: transistor, 409: FPC, 410: substrate, 410a: barrier film, 410b: substrate, 410c: resin layer, 411: wiring, 419: terminal, 421: insulating film, 428: partition wall, 450R: light-emitting element, 460: sealant, 467BM: light-blocking layer, 467p: anti-reflective layer, 467R: coloring layer, 470: substrate, 470a: barrier film, 470b: substrate, 470c: resin layer, 480R: light-emitting module, 490: substrate, 491: electrode, 492: electrode, 493: insulating layer, 494: wiring, 495: touch sensor, 497: resin layer, 498: wiring, 499: connection layer, 500: display device, 510L: housing, 510L(a): side surface, 510L(b): side surface, 510R: housing, 515L: opening portion, 515R: opening portion, 516L: guide, 520L: storage portion, 520R: storage portion, 521L: pulling mechanism, 523L: slider, 525L: rail, 550: mechanism.

This application is based on Japanese Patent Application serial no. 2013-090859 filed with Japan Patent Office on Apr. 24, 2013, the entire contents of which are hereby incorporated by reference.

The invention claimed is:

1. A display device comprising:
a hinge;
a first housing connected to the hinge, the first housing including a first storage portion, a first pulling mechanism in the first storage portion, and a first opening portion;
a second housing connected to the hinge, the second housing including a second storage portion, a second pulling mechanism in the second storage portion, and a second opening portion; and
a flexible display panel,
wherein the flexible display panel is configured to be stored in the first storage portion through the first opening portion, and to be drawn from the first storage portion through the first opening portion,
wherein the flexible display panel is configured to be stored in the second storage portion through the second opening portion and to be drawn from the second storage portion through the second opening portion,
wherein a part of the first housing and a part of the second housing are fixed to each other through the hinge,
wherein the first pulling mechanism is configured to pull one end of the flexible display panel,
wherein the second pulling mechanism is configured to pull the other end of the flexible display panel, wherein the one end of the flexible display panel is configured to move linearly in a direction, wherein the other end of the flexible display panel is connected to the second housing, wherein the flexible display panel extends along a plane between the first opening portion and the second opening portion when the display device is folded halfway, and wherein the flexible display panel is retracted within the first housing and the second housing and surrounded by the first housing and the second housing when the display device is in a closed position.

2. The display device according to claim 1, wherein the first opening portion includes a guide having a curvature radius of more than or equal to 1 mm and less than or equal to 10 mm on a hinge side.

3. The display device according to claim 1, wherein the first housing comprises a window that enables a display surface of the flexible display panel stored in the first storage portion to be observed through the window.

4. The display device according to claim 1, wherein the flexible display panel comprises a transistor including an oxide semiconductor.

5. A display device comprising:
a hinge;
a first housing connected to the hinge, the first housing including a first storage portion, a first pulling mechanism in the first storage portion, and a first opening portion;
a second housing connected to the hinge, the second housing including a second storage portion, a second pulling mechanism in the second storage portion, and a second opening portion; and
a flexible display panel,
wherein the flexible display panel is configured to be stored in the first storage portion through the first opening portion and to be drawn from the first storage portion through the first opening portion,
wherein the flexible display panel is configured to be stored in the second storage portion through the second opening portion and to be drawn from the second storage portion through the second opening portion,
wherein the flexible display panel includes a touch sensor,
wherein a part of the first housing and a part of the second housing are fixed to each other through the hinge,
wherein the first pulling mechanism is configured to pull one end of the flexible display panel,
wherein the second pulling mechanism is configured to pull the other end of the flexible display panel,
wherein the one end of the flexible display panel is configured to move linearly in a direction,
wherein the other end of the flexible display panel is connected to the second housing,
wherein the flexible display panel extends along a plane between the first opening portion and the second opening portion when the display device is folded halfway, and
wherein the flexible display panel is retracted within the first housing and the second housing and surrounded by the first housing and the second housing when the display device is in a closed position.

6. The display device according to claim 5, wherein the first opening portion includes a guide having a curvature radius of more than or equal to 1 mm and less than or equal to 10 mm on a hinge side.

7. The display device according to claim 5, wherein the first housing comprises a window that enables a display surface of the flexible display panel stored in the first storage portion to be observed through the window.

8. The display device according to claim 5, wherein the flexible display panel comprises a transistor including an oxide semiconductor.

9. A display device comprising:
a housing portion including a first housing and a second housing, the housing portion being configured to be foldable at a hinge between the first housing and the second housing; and
a flexible display panel, one end of the flexible display panel is connected to the second housing,
wherein the first housing includes a first space, a first pulling mechanism in the first space and a first opening portion,
wherein the second housing includes a second space, a second pulling mechanism in the second space and a second opening portion,
wherein the flexible display panel is configured to be stored in the first space and to be drawn from the first space,
wherein the flexible display panel is configured to be stored in the second space and to be drawn from the second space,
wherein the first pulling mechanism is connected to the other end of the flexible display panel,
wherein the second pulling mechanism is connected to the one end of the flexible display panel,
wherein the other end of the flexible display panel is configured to move linearly in a direction,
wherein the flexible display panel extends along a plane between the first opening portion and the second opening portion when the display device is folded halfway, and
wherein the flexible display panel is retracted within the first housing and the second housing and surrounded by the first housing and the second housing when the display device is in a closed position.

10. The display device according to claim 9, wherein the first space includes a guide having a curvature radius of more than or equal to 1 mm and less than or equal to 10 mm.

11. The display device according to claim 9, wherein the first housing comprises a window that enables a display surface of the flexible display panel stored in the first space to be observed through the window.

12. The display device according to claim 9, wherein the flexible display panel comprises a transistor including an oxide semiconductor.

13. The display device according to claim 9, wherein the flexible display panel includes a touch sensor.

14. The display device according to claim 3,
wherein the first housing comprises a first outer surface comprising the first opening portion and a second outer surface,
wherein the first outer surface and the second outer surface are on opposite sides of the first housing, and
wherein the second outer surface includes the window.

15. The display device according to claim 7,
wherein the first housing comprises a first outer surface comprising the first opening portion and a second outer surface,
wherein the first outer surface and the second outer surface are on opposite sides of the first housing, and
wherein the second outer surface includes the window.

16. The display device according to claim 11,
wherein the first housing comprises a first outer surface comprising the first opening portion and a second outer surface,
wherein the first outer surface and the second outer surface are on opposite sides of the first housing,
wherein the flexible display panel is configured to be stored in the first space through the first opening portion, and
wherein the second outer surface includes the window.

\* \* \* \* \*